(12) United States Patent
Oku

(10) Patent No.: US 6,717,195 B2
(45) Date of Patent: Apr. 6, 2004

(54) FERROELECTRIC MEMORY

(75) Inventor: Yoshiaki Oku, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 10/187,193

(22) Filed: Jun. 28, 2002

(65) Prior Publication Data

US 2003/0021479 A1 Jan. 30, 2003

(30) Foreign Application Priority Data

Jun. 29, 2001 (JP) .................................. P.2001-198941

(51) Int. Cl.$^7$ ................................................. H01L 29/76
(52) U.S. Cl. ..................... 257/295; 257/295; 257/296; 257/414; 365/117; 365/185; 365/145

(58) Field of Search .............................. 257/295, 414, 257/421; 365/145, 185.08

(56) References Cited

U.S. PATENT DOCUMENTS 5,998,819 A * 12/1999 Yokoyama et al. .......... 257/295
6,370,056 B1 * 4/2002 Chen et al. ................. 365/145

* cited by examiner

Primary Examiner—David Nelms
Assistant Examiner—Mai-Huong Tran
(74) Attorney, Agent, or Firm—Merchant & Gould, P.C.

(57) ABSTRACT

In an FET having an MFMIS structure in which a floating gate, a ferroelectric layer and a control gate are sequentially provided through a gate insulating film on the surface of a source—drain region formed on the surface of a semiconductor substrate, the ferroelectric layer is constituted by an inorganic film having a vacancy rate of 50% or more.

5 Claims, 7 Drawing Sheets

FERROELECTRIC MEMORY

BACKGROUND OF THE INVENTION

1. Field of the Invention

The present invention relates to a ferroelectric memory and a method of manufacturing the ferroelectric memory, and more particularly to a ferroelectric memory comprising a ferroelectric film which is an inorganic dielectric film having a low dielectric constant.

2. Description of the Related Art

A ferroelectric memory which is currently studied is roughly divided into two parts. One of them is a memory using a method of detecting the inversed electric charge quantity of a ferroelectric capacitor and constituted by the ferroelectric capacitor and a selective transistor.

The other is a memory using a method of detecting a change in the resistance of a semiconductor by the spontaneous polarization of a ferroelectric. The method typically includes an MFSFET. The MFSFET has an MIS structure using a ferroelectric for a gate insulating film. With this structure, it is necessary to directly form a dielectric on the surface of the semiconductor and the interface of the ferroelectric/semiconductor is hard to control. For this reason, it is very hard to manufacture a memory element of high quality. Currently, a memory structure having a buffer layer provided on a ferroelectric/semiconductor interface is a mainstream. However, the inventors have proposed an FET having an MFMIS structure in which a metal layer (M) and an insulating layer (I) are provided as buffer layers on the ferroelectric/semiconductor interface as shown in FIG. 4. The FET having the MFMIS structure comprises a gate oxide film 5, a floating gate 6, a ferroelectric film 7 and a control gate 8 which are sequentially provided on a channel region 4 formed between source and drain regions 2 and 3 of a semiconductor substrate 1.

With this structure, usually, when the semiconductor substrate 1 is provided and a positive voltage is applied to the control gate 8, the ferroelectric film 7 causes a polarization inversion. Even if the voltage of the control gate 8 is removed, a negative electric charge is generated in a channel formation region CH by the residual polarization of the ferroelectric film 7. This state is set to be "1".

To the contrary, when a negative voltage is applied to the control gate 8, the ferroelectric film 8 causes a polarization inversion in a reverse direction. Even if the voltage of the control gate 8 is removed, a positive electric charge is generated in the channel formation region CH by the residual polarization of the ferroelectric film 8. This state is set to be "0". Thus, information "1" or "0" can be written to the FET.

The written information is read by the application of a reading voltage $V_r$ to the control gate 8. The reading voltage $V_r$ is set to be a value between a threshold voltage $V_{th1}$ in the state of "1" and a threshold voltage $V_{th0}$ in the state of "0". By detecting that a drain current flows or not when the reading voltage $V_r$ is applied to the control gate 8, it is possible to decide whether the written information is "1" or "0".

According to the FET having the MFMIS structure, thus, one memory cell can be constituted by one element and nondestructive readout can be carried out well.

However, such an FET having the MFMIS structure has the following problem. At time of writing, the FET has such a configuration that a capacitor $C_f$ (a capacitance $C_f$) of the ferroelectric film 7 and a capacitor $C_{ox}$ (a capacitance $C_{ox}$) of the gate oxide film 5 are connected in series (see FIG. 5). $C_D$ represents a drain capacitance and is disregarded herein. In the case in which a voltage V is applied between the substrate 1 and the control gate 8, therefore, the voltage V is divided into $V_f$ and $V_{ox}$ so that the following equation (1) is obtained.

$$V = V_f + V_{ox}$$

$$C_f V_f = C_{ox} V_{ox} = q \quad (q: \text{quantity of electric charge generated by capacitor}) \tag{1}$$

Accordingly, a partial pressure $V_f$ expressed in the following equation is applied to the capacitor $C_f$ of the ferroelectric film 7.

$$V_f = C_{ox}/(C_f + C_{ox}) \cdot V \tag{2}$$

On the other hand, it is necessary to increase $V_f$ to some extent in order to carry out a polarization inversion over the ferroelectric film 7 during writing.

Accordingly, it is necessary to reduce the capacitance of the ferroelectric film against the capacitance of the gate insulating film. For example, however, there is a problem in that the relative dielectric constant of PZT is approximately 200 to 1000 and is much higher than a relative dielectric constant of 3.9 of a silicon oxide film constituting the gate insulating film.

For this reason, it is hard to increase the partial pressure $V_f$ in the equation (1). Accordingly, there is a problem in that it is hard to carry out the polarization inversion over the ferroelectric film 7 during writing.

SUMMARY OF THE INVENTION

In order to solve the problem, it is necessary to reduce the thickness of a film in order to decrease the relative dielectric constant of the ferroelectric film as much as possible. By reducing the thickness of the film, thus, it is possible to increase the partial pressure $V_f$. On the other hand, when the thickness of the film is reduced, a leakage current is actually generated between the floating gate and the control gate, causing a deterioration in a memory characteristic.

In order to increase the speed of a ferroelectric memory and to reduce power consumption, thus, it is an important object to reduce a dielectric constant with a decrease in the relative dielectric constant of a ferroelectric film.

The insulating film has variously been devised in order to reduce a dielectric constant. In general, the following methods have conventionally been proposed to reduce the dielectric constant of the insulating film:

(1) to add fluorine to a silica film to be an inorganic insulating film;

(2) to form an organic insulating material having a low dielectric constant as a parent material; and (3) to intentionally form a porous film.

In the case of the method (1), however, since the heat resistance of the insulating film is deteriorated, the addition is carried out in an element ratio of several % at most. Consequently, there is a problem in that the relative dielectric constant can be reduced by only 10 to 15% of that of a conventional insulating film.

In the case of the method (2), moreover, the organic material is formed. For this reason, there is a problem in that the heat resistance is considerably deteriorated as compared with a conventional silica based insulating film, resulting in a reduction in the reliability of a semiconductor element.

Therefore, the organic material cannot be applied to a ferroelectric film at all.

In the case of the (3), furthermore, since a porous structure is random, the mechanical strength of the insulating film is remarkably reduced and the insulating film is apt to be broken in packaging, causing a reduction in the reliability of a semiconductor element.

In many cases, moreover, the porous structure is not closed. If the porous structure is not closed, the moisture resistance of the insulating film is remarkably deteriorated, causing a reduction in the reliability of the semiconductor element.

In the conventional insulating film as well as the ferroelectric film, thus, there is a problem in that the dielectric constant cannot be reduced sufficiently, and furthermore, the mechanical strength is also insufficient.

In consideration of the circumstances, it is an object of the invention to reduce a leakage current and to enhance the data holding characteristic of a ferroelectric memory in order to increase the speed of the ferroelectric memory and to decrease power consumption.

More specifically, it is an object of the invention to provide a ferroelectric film having a low dielectric constant and a high mechanical strength.

The invention is characterized in that a ferroelectric layer is constituted by an inorganic film having a vacancy rate of 50% or more in an FET having an MFMIS structure.

More specifically, the invention provides a first ferroelectric memory comprising an FET having an MFMIS structure in which a floating gate, a ferroelectric layer and a control gate are sequentially provided through a gate insulating film on a surface of a semiconductor substrate between source and drain regions formed on the surface of the semiconductor substrate, wherein the ferroelectric layer is constituted by an inorganic insulating film having a vacancy rate of 50% or more.

According to such a structure, since air has a low dielectric constant, the dielectric constant can further be reduced as compared with the addition of fluorine so that the dielectric constant of the insulating film can be reduced as much as possible. Accordingly, a polarization inversion voltage can be dropped and a driving voltage can be reduced. Moreover, since the film has a great mechanical strength and a high reliability, a leakage current between the floating gate and the control gate can also be reduced.

It is desirable that the ferroelectric film should be constituted by $STN(Sr_2(Ta_{1-x}Nb_x)_2O_7)x: 0<x<1$.

In the STN, an ordinary material itself has a relative dielectric constant of approximately 40 to 50. By setting the vacancy rate to 50% or more, the relative dielectric constant can be reduced to approximately 20 to 25 or less. Consequently, it is possible to reduce a leakage current without greatly dropping a voltage to be applied to the ferroelectric film.

It is desirable that the vacancy of the inorganic insulating film should have a degree of orientation.

According to such a structure, the vacancy has the degree of orientation and a periodic porous structure. Therefore, the mechanical strength can be increased so that a ferroelectric film having a high reliability can be obtained.

Moreover, it is desirable that the inorganic insulating film should be formed on the surface of the substrate and should have a periodic porous structure including a cylindrical vacancy orientated in parallel with the surface of the substrate.

According to such a structure, since the vacancy is oriented in parallel with the surface of the substrate, a low dielectric constant can be uniformly obtained in a direction perpendicular to the surface of the substrate. Moreover, it is possible to serve as an effective thin film having a low dielectric constant in which a moisture resistance is excellent and a reliability is high.

It is desirable that there should be a plurality of periodic porous structure domains including a cylindrical vacancy oriented in one direction in parallel with the surface of the substrate, and the adjacent porous structure domains should be oriented in different directions from each other.

According to such a structure, the porous structure is oriented in a different direction for each domain. Therefore, the opening portions of the vacancies can be closed each other, and it is possible to obtain a thin film having an extremely low dielectric constant in which a moisture resistance is almost as high as that of a fine film and the periodic structure can also give a high mechanical strength. Furthermore, an interlayer space is supported by an adjacent layer. Consequently, a layered periodic porous shape which is usually supposed to be unstable can be taken with a stable and high mechanical strength.

The invention provides a method of manufacturing a ferroelectric memory comprising an FET having an MFMIS structure in which a floating gate, a ferroelectric layer and a control gate are sequentially provided through a gate insulating film on a surface of a semiconductor substrate between source and drain regions formed on the surface of the semiconductor substrate, wherein a process for forming the ferroelectric layer comprises a step of producing a precursor solution containing a derivative and a surfactant, a preliminary crosslinking step of raising a temperature of the precursor solution and starting a crosslinking reaction, a contact step of causing the precursor solution starting a crosslinking reaction at the preliminary crosslinking step to come in contact with the surface of the substrate, and a step of burning the substrate with which the precursor solution is caused to come in contact and decomposing and removing the surfactant.

According to such a structure, it is possible to provide an insulating film having a very excellent controllability, a high mechanical strength and an extremely low dielectric constant.

Moreover, it is possible to properly change the vacancy rate by regulating the concentration of a precursor solution. Thus, it is possible to form an insulating thin film having a very high workability and a desirable dielectric constant.

It is desirable that the substrate should be immersed in the precursor solution at the contact step.

According to such a structure, it is possible to form an insulating film having a low dielectric constant with a high productivity.

Moreover, it is desirable that the substrate should be immersed in the precursor solution and should be pulled up at a desirable speed in the contact step.

According to such a structure, it is possible to form an insulating film having a low dielectric constant with a high productivity.

It is desirable that the substrate should be coated with the precursor solution at the contact step.

According to such a structure, it is possible to form an insulating film having a low dielectric constant with a high productivity.

It is desirable that the contact step should be a spin coating step of dropping the precursor solution onto the substrate and rotating the substrate.

According to such a structure, the thickness of the film and the vacancy rate can be regulated easily so that an insulating film having a low dielectric constant can be formed with a high productivity.

DESCRIPTION OF THE PREFERRED EMBODIMENTS

A ferroelectric memory and a method of manufacturing the ferroelectric memory according to an embodiment of the invention will be described in detail with reference to the drawings.

First Embodiment

Figure 1:
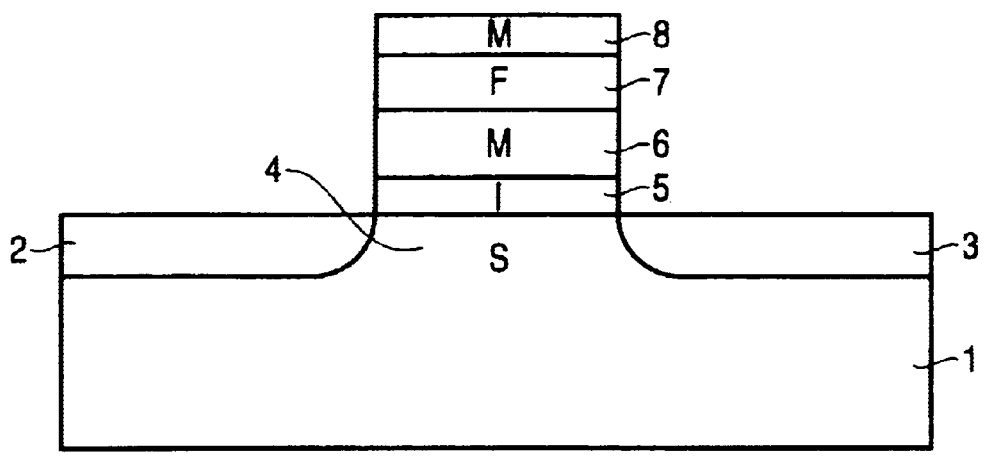
FIG. 1 is a view showing a ferroelectric memory having an MFMIS structure according to a first embodiment of the invention.

As a first embodiment of the invention, a ferroelectric memory using STN as a dielectric film will be described. As shown in FIG. 1, the ferroelectric memory constitutes an FET having an MFMIS structure in which a floating gate 6 formed of an iridium layer having a thickness of 100 nm, a ferroelectric layer 7 formed of STN having a vacancy rate of 50% and a thickness of 150 nm, and a control gate 8 formed of Pt having a thickness of 200 nm are sequentially provided through a gate insulating film 5 formed of a silicon oxide film having a thickness of 10 nm on the surface of a channel region 4 between source and drain regions 2 and 3 comprising p-type impurity regions formed on the surface of an n-type silicon substrate 1.

Figure 2:
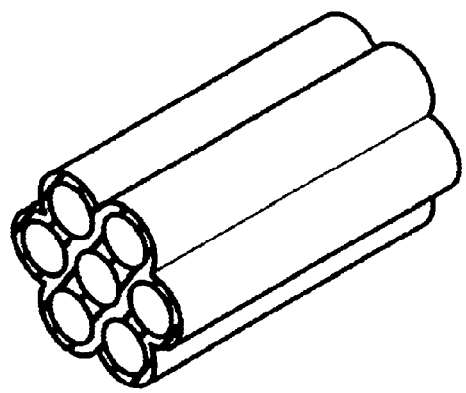
FIG. 2 is a view illustrating the structure of the ferroelectric thin film of the ferroelectric memory shown in FIG. 1, FIGS. 3(a)–3(d) show views illustrating a process for forming the ferroelectric memory according to the first embodiment of the invention.

As in an enlarged view of FIG. 2, the STN constituting the ferroelectric film has a porous structure in which a cylindrical vacancy is oriented in parallel with the surface of the substrate.

According to such a structure, a relative dielectric constant is reduced to approximately 20 to 25 or less. Therefore, a leakage current can be decreased, a drop in a voltage can be reduced by approximately 10% and a voltage to be applied to the ferroelectric film can be maintained to be sufficiently high.

Thus, it is possible to obtain a nonvolatile memory having a higher reliability.

While the STN is used as the ferroelectric film in the embodiment, the invention is not restricted but may be properly changed.

Next, description will be given to a process for manufacturing the ferroelectric memory having the MIFMIS structure. FIGS. 3(a) to 3(d) are views showing the manufacturing process.

As shown in FIG. 3(a), first of all, the surface of the n-type silicon substrate 1 is thermally oxidized and the silicon oxide layer 5 having a thickness of approximately 600 nm is formed, and an iridium layer to be the floating gate is formed on the silicon oxide layer 2 by sputtering using iridium as a target. Next, a heat treatment is carried out for one minute at 800° C. (and so forth) in the $O_2$ atmosphere to form an iridium oxide layer 6b on the surface of an iridium layer 6a.

Figure 6:
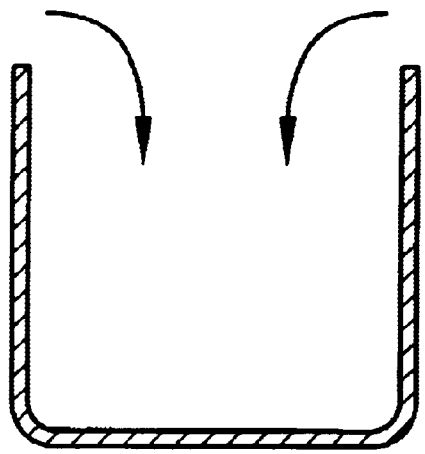
FIGS. 6(a)–6(b) show views illustrating a process for forming the ferroelectric film of the ferroelectric memory according to the first embodiment of the invention.
Figure 6:
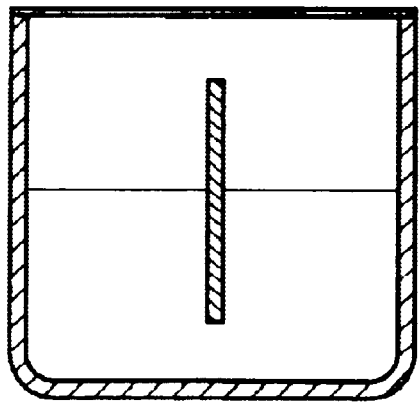

Subsequently, a PZT film having a porous structure is formed as the ferroelectric film 7 on the iridium oxide layer 6b by a sol-gel method. As a starting material, a $Pb(CH_3COO)_2 \cdot 3H_2O$, $Zr(t-OC_4H_9)_4$, $Ti(i-OC_3H_7)_4$ derivative solution is used. As shown in FIG. 6(a), first of all, cation type cetyltrimethylammonium bromide (CTAB: $C_{16}H_{33}N^+(CH_3)_3$) to be a surfactant and hydrochloric acid (HCl) to be an acid catalyst are dissolved in an $H_2O$/alcohol mixed solvent to prepare a precursor solution in a mixing vessel. The mixture is carried out in a mole ratio of preparation of the precursor solution of 0.05 of the surfactant, 0.1 of the $Pb(CH_3COO)_2 \cdot 3H_2O$, $Zr(t-OC_4H_9)_4$, $Ti(i-OC_3H_7)_4$ derivative and 2 of the acid catalyst for 100 of the solvent. The substrate having the floating gate 6 formed thereon is immersed in the mixed solution, and the mixing vessel is hermetically closed as shown in FIG. 6(b) and is then held at 30 to 150° C. for 1 to 120 hours to polymerize the $Pb(CH_3COO)_2 \cdot 3H_2O$, $Zr(t-OC_4H_9)_4$, $Ti(i-OC_3H_7)_4$ derivative with a hydrolytic polycondensation reaction (a preliminary crosslinking step), thereby forming a mesoporous thin film in which the periodic autoaggregate of the surfactant is used as a template.

In the autoaggregate, a spherical micell structure (FIG. 7(b)) having a plurality of molecules agglutinated is formed and a cylinder (FIG. 7(c)) having a surfactant oriented is formed with an increase in a concentration as shown in FIG. 7(a).

Then, the substrate is pulled up and washed, and is then dried at 150° C. and is preliminarily burned for 30 minutes at 400° C. in the dry air atmosphere. This operation is repeated five times and a heat treatment is then carried out at 700° C. or more in the $O_2$ atmosphere. As shown in FIG. 7(e), thus, the surfactant of the template is completely decomposed thermally and removed to form a ferroelectric film 7 having a thickness of 250 nm which is formed of a pure mesoporous thin film. Herein x is set to 0.52 in $PbZr_xTi_{1-x}O_3$ (hereinafter referred to as PZT(52/48) and a PZT film is thus formed.

Furthermore, an iridium layer 8a is formed on the ferroelectric film 7 by sputtering. Next, a heat treatment is carried out for one minute at 800° C. in the $O_2$ atmosphere so that an iridium oxide layer 8b is formed on the surface of the iridium layer 8a (FIG. 3(b)). The iridium layer 8a and the iridium oxide layer 8b are set to be the control gate 8. The iridium layer 8a and the iridium oxide layer 8b are formed to have a thickness of 200 nm together. Thus, a ferroelectric capacitor can be obtained.

As shown in FIG. 3(c), then, the ferroelectric capacitor is subjected to patterning by photolithography, thereby forming a resist pattern R, and the surface of regions to be a source and a drain are exposed by using the resist pattern R as a mask.

Figure 3:
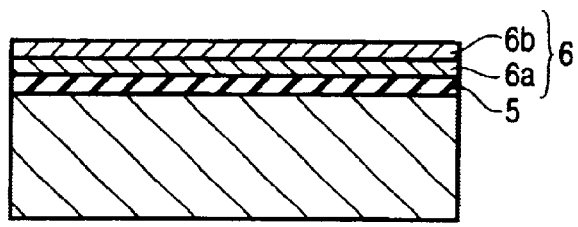
Figure 3:
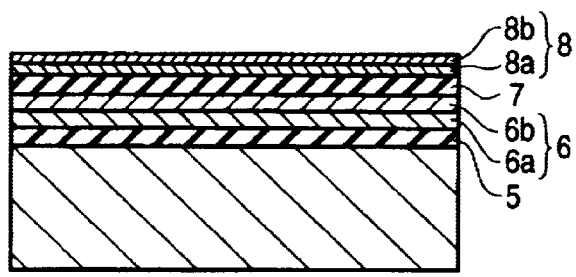
Figure 3:
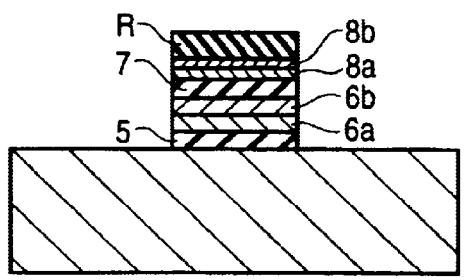
Figure 3:
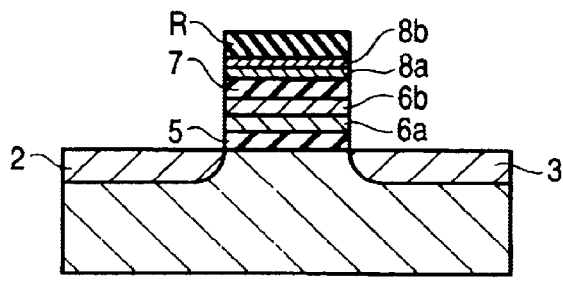
Figure 4:
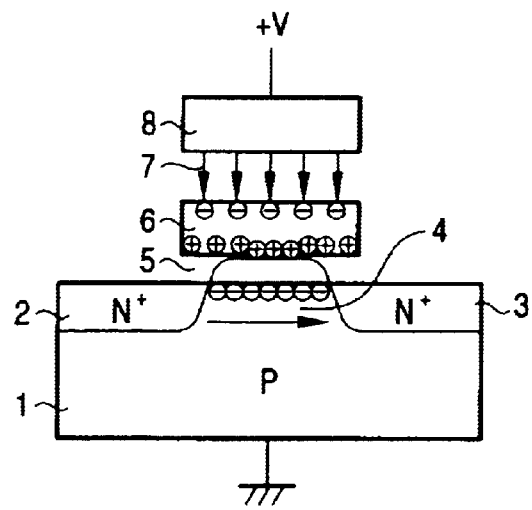
FIGS. 4(a)–4(b) show views illustrating the operation of the ferroelectric memory.
Figure 4:
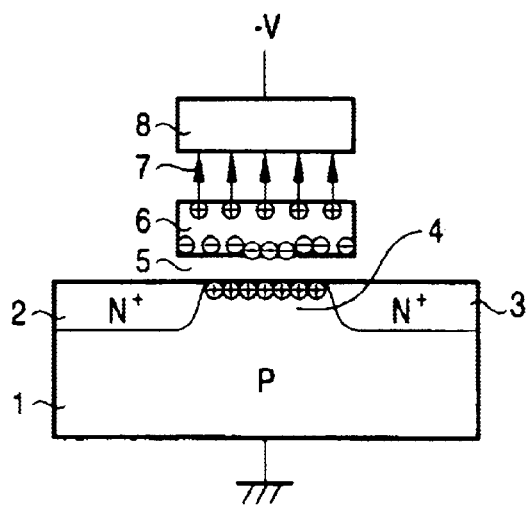
Figure 5:
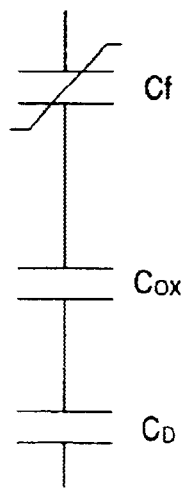
FIG. 5 is an equivalent circuit diagram showing the capacity of the ferroelectric memory.

Thereafter, a boron (B) ion is implanted by using the gate electrode pattern as a mask. As shown in FIG. 3($d$), consequently, the source and drain regions 2 and 3 formed of a p-type diffusion layer are formed.

Furthermore, an interlayer insulating film and a wiring pattern are formed so that a ferroelectric memory is finished.

According to such a structure, the ferroelectric film is formed by the porous structure having a vacancy rate of 50%. Therefore, it is possible to greatly reduce a dielectric constant with an ordinary film thickness. Therefore, a voltage to be applied to the ferroelectric film can be increased sufficiently. Moreover, since a dielectric constant can greatly be reduced with an ordinary film thickness, a leakage current is not generated. Furthermore, since a mechanical strength is high, it is possible to provide a ferroelectric memory having a high reliability.

Moreover, it is possible to desirably regulate the vacancy rate and the structure of the vacancy by only preparing the precursor solution prior to coating without changing the material of a ferroelectric itself.

Furthermore, it is possible to easily implement such a structure that the vacancy rate is changed in the direction of a film thickness. It is also possible to easily make a conventional fine structure, thereby maintaining an adhesion and increasing a vacancy rate therein in the vicinity of the interface of the control gate and the floating gate.

According to such a structure, it is possible to reduce the leakage current, and furthermore, to improve a ferroelectric characteristic with an enhancement in the adhesion.

While STN and PZT are used for the ferroelectric films in the embodiment, the invention can also be applied to a ferroelectric such as SBT or a dielectric film having a high dielectric constant such as BST.

While a two-layer structure comprising iridium and iridium oxide has been employed for an electrode in the embodiment, the invention is not restricted thereto but another material can also be used. Moreover, it is also possible to insert an adhesion layer or an insulating barrier layer between the substrate and the floating gate or between the electrode and the ferroelectric layer. It is also possible to apply, to the insulating barrier layer, titanium, tantalum, zirconium, tungsten or their nitrides, and furthermore, oxides obtained by causing a refractory metal such as TaAlN or TaSiN to contain aluminum or silicon.

Moreover, since the vacancy is oriented in parallel with the surface of the substrate, a low dielectric constant is uniformly obtained in a direction perpendicular to the surface of the substrate. In particular, it is possible to employ such a closed structure that has no opening portion for a floating gate and a wiring to be upper layers and a substrate. Thus, it is possible to form an effective thin film having a low dielectric constant in which a moisture resistance is excellent and a reliability is high. Accordingly, a leakage current is not generated and an interlayer insulating film having a long lifetime can be obtained.

The composition of the precursor solution is not restricted to that of the embodiment but it is desirable to take a composition of 0.01 to 0.1 of a surfactant, 0.01 to 0.5 of a derivative, and 0 to 5 of an acid catalyst for 100 of a solvent. By using a precursor solution having such a structure, it is possible to form an insulating film having a low dielectric constant including a cylindrical vacancy.

Moreover, while the cation type cetyltrimethylammonium bromide (CTAB: $C_{16}H_{33}N^+(CH_3)_3Br^-$) is used as the surfactant in the embodiment, the invention is not restricted thereto but it is a matter of course that another surfactant may be used.

If an alkali ion such as an Na ion is used as a catalyst, a deterioration is caused. Therefore, it is desirable that a cation type surfactant should be used as a semiconductor material and an acid catalyst should be used as a catalyst. For the acid catalyst, it is also possible to use, for the acid catalyst, nitric acid ($HNO_3$), sulfuric acid ($H_2SO_4$), phosphoric acid ($H_3PO_4$) and $H_4SO_4$ in addition to HCl.

Furthermore, while the water $H_2O$/alcohol mixed solvent is used as a solvent, only water is enough.

Moreover, while the oxygen atmosphere is used for the burning atmosphere, the invention can be applied in the air, under a reduced pressure or in the nitrogen atmosphere. Desirably, burning using a foaming gas comprising a mixed gas of nitrogen and hydrogen is added so that a moisture resistance can be enhanced and a leakage current can be reduced.

In addition, it is possible to properly change the mixing ratio of the surfactant, the derivative, the acid catalyst and the solvent.

Furthermore, the preliminary polymerizing step is held for 1 to 120 hours at 30 to 150° C., it is desirably held at 60 to 120° C. and more desirably 90° C.

Moreover, the burning step is held for 1 hour at 400° C., it may be held for approximately 1 to 5 hours at 300 to 500° C. and desirably 350 to 450° C.

Second Embodiment

Figure 7:
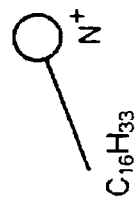
FIGS. 7(a)–7(f) show views illustrating the process for forming the ferroelectric film of the ferroelectric memory according to the first embodiment of the invention.
Figure 7:
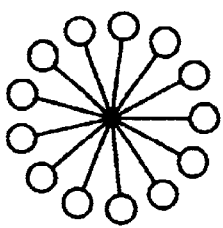
Figure 7:
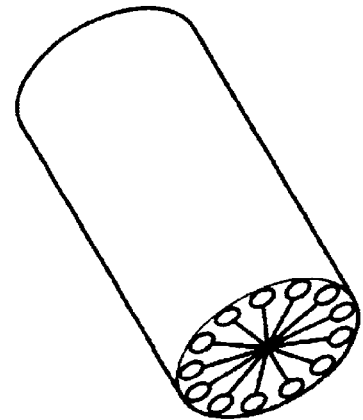
Figure 7:
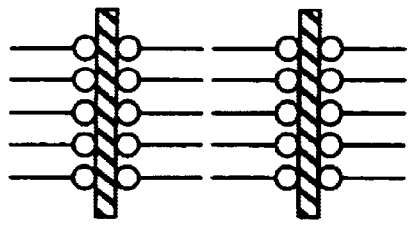
Figure 7:
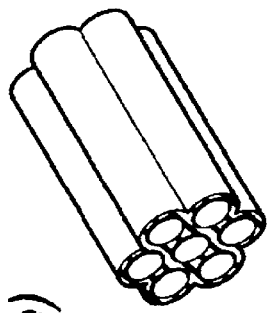
Figure 7:
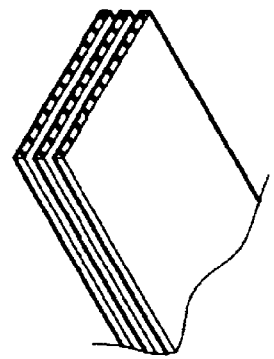

While the vacancy is formed cylindrically in the first embodiment, the vacancy can be oriented like a layer as shown in FIG. 7($d$) by increasing the concentration of a surfactant. By burning the layered vacancy, it is possible to obtain such a structure that the vacancy is oriented like a layer as shown in FIG. 7($f$).

Third Embodiment

Figure 8:
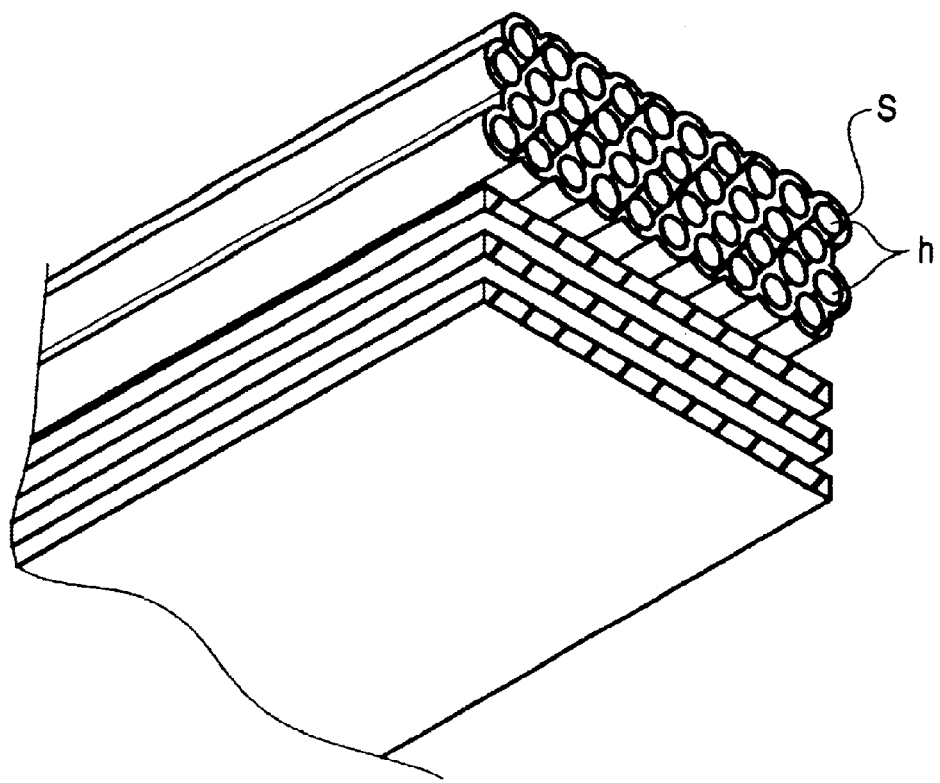
FIG. 8 is a view illustrating the structure of the ferroelectric film of a ferroelectric memory according to a third embodiment of the invention.

While the vacancy h is formed cylindrically in the first embodiment and the vacancy h is formed like a layer in the second embodiment, their lamination structure may be used as shown in FIG. 8, and furthermore, a skeletal surface can also be covered by a hydrophobic layer S to increase a moisture resistance still more.

The hydrophobic layer can easily be formed by carrying out a silanization treatment after burning.

Fourth Embodiment

Figure 9:
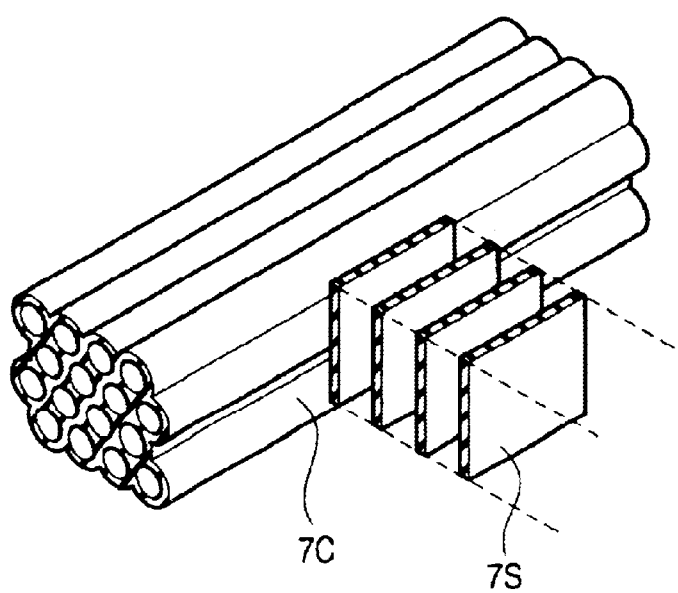
FIG. 9 is a view illustrating the structure of the ferroelectric film of a ferroelectric memory according to a fourth embodiment of the invention.

While the vacancy is formed cylindrically in the first embodiment and the vacancy is formed like a layer in the second embodiment, their combination may be used as shown in FIG. 9. By employing such a structure that a plurality of different porous structure domains are present, it is also possible to further enhance the moisture resistance.

Fifth Embodiment

Figure 10:
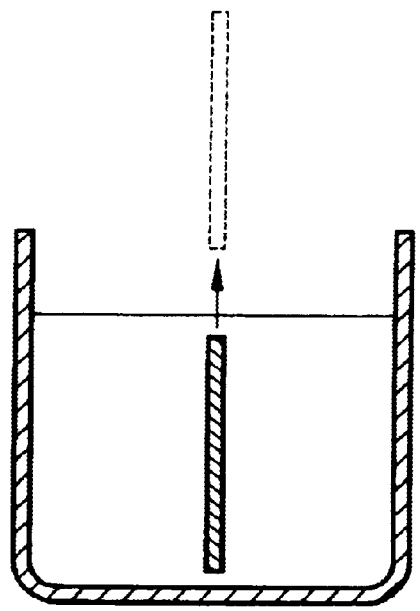
FIG. 10 is a view illustrating a method of forming an insulating film according to a fifth embodiment of the invention.

While the mesoporous thin film is formed by the immersion in the precursor solution in the first embodiment, the immersion is not restricted but a dip coating method may be used as shown in FIG. 10.

More specifically, a substrate is caused to descend vertically at a speed of 1 mm/s to 10 m/s with respect to the liquid level of a regulated precursor solution and is thus sunk in the solution, and is stationarily put for one second to one hour.

After a desirable time passes, the substrate is vertically lifted again at a speed of 1 mm/s to 10 m/s and is then taken out of the solution.

Finally, burning is carried out in the same manner as in the first embodiment. Consequently, a surfactant is completely decomposed thermally and removed to form a pure mesoporous thin film.

Sixth Embodiment

Figure 11:
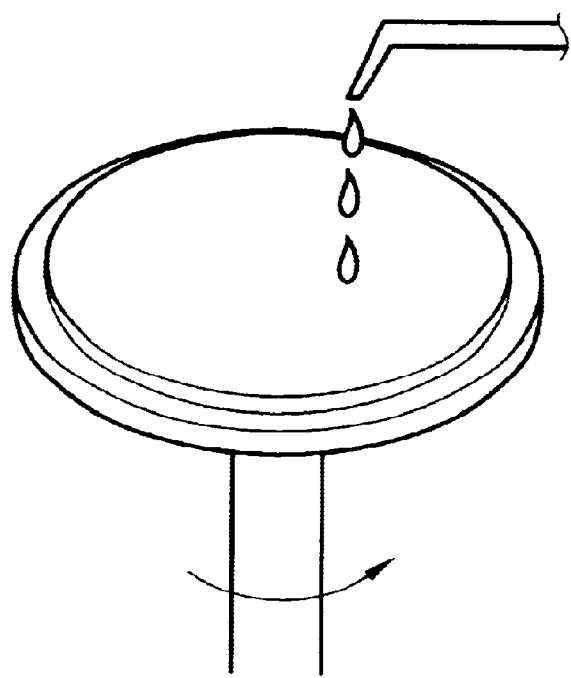
FIG. 11 is a view illustrating a method of forming an insulating film according to a sixth embodiment of the invention.

While the mesoporous thin film is formed by the immersion in the precursor solution in the first embodiment, the immersion is not restricted but a spin coating method may be used as shown in FIG. 11.

The precursor solution formed in the same manner as in the embodiments is dropped onto the surface of a substrate to be treated which is mounted on a spinner and is rotated at 500 to 5000 rpm so that a mesoporous thin film is obtained.

Finally, burning is carried out in the same manner as in the first embodiment. Consequently, a surfactant is completely decomposed thermally and removed to form a pure mesoporous thin film.

In addition, while the ferroelectric memory of the MFMIS type has been described in the embodiments, the invention can also be applied to a ferroelectric memory having another structure.

As described above, according to the invention, a ferroelectric thin film having a vacancy rate of 50% or more is used as a ferroelectric film. Therefore, a dielectric constant can be reduced. Consequently, it is possible to drop a polarization inversion voltage, and to increase a driving speed and to reduce a driving voltage.

Moreover, since the film has a great mechanical strength and a high reliability, a leakage current between the floating gate and the control gate can also be reduced. It is possible to easily obtain an insulating film which has an excellent controllability, a high mechanical strength and a very low dielectric constant.

What is claimed is:

1. A ferroelectric memory comprising an FET having an MFMIS structure in which a floating gate, a ferroelectric layer and a control gate are sequentially provided through a gate insulating film on a surface of a semiconductor substrate between source and drain regions formed on the surface of the semiconductor substrate, wherein the ferroelectric layer is constituted by an inorganic insulating film having a vacancy rate of 50% or more.

2. The ferroelectric memory according to claim 1, wherein the ferroelectric film is constituted by STN($Sr_2(Ta_{1-x}Nb_x)_2O_y$)x: $0<x<1$ and $1<y<7$.

3. The ferroelectric memory according to claim 1, wherein the inorganic insulating film is formed on the surface of the substrate and a vacancy has a degree of orientation.

4. The ferroelectric memory according to claim 1, wherein the inorganic insulating film is formed on the surface of the substrate and has a periodic porous structure including a cylindrical vacancy orientated in parallel with the surface of the substrate.

5. The ferroelectric memory according to claim 1, wherein the inorganic insulating film is formed on the surface of the substrate and includes a plurality of periodic porous structure domains including a cylindrical vacancy oriented in one direction in parallel with the surface of the substrate, and the adjacent porous structure domains are oriented in different directions from each other.

* * * * *